United States Patent
Jiang

(12) United States Patent (10) Patent No.: US 10,954,592 B2
Jiang (45) Date of Patent: Mar. 23, 2021

(54) EVAPORATION SOURCE HEATING SYSTEM WITH SOAKING LAYER

(71) Applicant: Shenzhen China Star Optoelectronics Semiconductor Display Technology Co., Ltd., Guangdong (CN)

(72) Inventor: Liang Jiang, Guangdong (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 346 days.

(21) Appl. No.: 15/738,981

(22) PCT Filed: Jul. 7, 2017

(86) PCT No.: PCT/CN2017/092255
§ 371 (c)(1),
(2) Date: Dec. 21, 2017

(87) PCT Pub. No.: WO2019/000484
PCT Pub. Date: Jan. 3, 2019

(65) Prior Publication Data
US 2018/0371606 A1 Dec. 27, 2018

(30) Foreign Application Priority Data
Jun. 26, 2017 (CN) .......................... 201701495891.6

(51) Int. Cl.
C30B 35/00 (2006.01)
C23C 14/26 (2006.01)
C23C 14/24 (2006.01)

(52) U.S. Cl.
CPC ............ *C23C 14/26* (2013.01); *C23C 14/243* (2013.01)

(58) Field of Classification Search
CPC ......... C30B 23/00; C30B 23/02; C30B 23/06; C30B 23/066; C30B 29/00; C30B 29/54; C30B 35/00; C30B 35/002
(Continued)

(56) References Cited

U.S. PATENT DOCUMENTS

| 1,975,436 A * | 10/1934 | Sorrel | ...................... | H05B 6/22 |
| | | | | 219/632 |
| 2001/0005553 A1* | 6/2001 | Witzman | .............. | C23C 14/243 |
| | | | | 428/402 |

(Continued)

FOREIGN PATENT DOCUMENTS

| CN | 1421542 A | 6/2003 |
| CN | 102268642 A | 12/2011 |

(Continued)

*Primary Examiner* — Kenneth A Bratland, Jr.
(74) *Attorney, Agent, or Firm* — Nelson Mullins Riley & Scarborough LLP; Kongsik Kim, Esq.

(57) ABSTRACT

The present invention discloses an evaporation source heating system including a vacuum heating container, a first heating source disposed around an outer peripheral surface of the heating container and a soaking layer disposed in the heating container, and the soaking layer is disposed opposite to an inner wall of the heating container so as to uniformly transmit heat emitted from the inner wall of the heating container. The present invention provides the soaking layer in the heating container of the evaporation source heating system, on one hand, a risk of material crack caused due to exorbitant local temperature is avoided, and on the other hand, heating uniformity is also improved. In addition, by heating the soaking layer in the heating container, time needed for realizing uniform heating is sharply shortened, and a heating state of the system is also real-time controlled more conveniently.

10 Claims, 4 Drawing Sheets

(58) Field of Classification Search
USPC ........ 117/200, 204, 206; 118/715, 722, 724, 118/726
See application file for complete search history.

(56) References Cited

U.S. PATENT DOCUMENTS

2001/0008121 A1* 7/2001 Tanabe .................... C23C 14/26
 118/663
2012/0285381 A1* 11/2012 Dussert-Vidalet ..........................
 C23C 16/45578
 118/726
2018/0347030 A1* 12/2018 Mu ......................... C23C 14/26

FOREIGN PATENT DOCUMENTS

| CN | 103849837 | A | * | 6/2014 |
| CN | 205473956 | | * | 8/2016 |
| CN | 205473956 | U | | 8/2016 |
| CN | 106835029 | A | | 6/2017 |
| JP | 2007262478 | A | | 10/2007 |

* cited by examiner

EVAPORATION SOURCE HEATING SYSTEM WITH SOAKING LAYER

CROSS-REFERENCES TO RELATED APPLICATIONS

This application is a U.S. national phase application, pursuant to 35 U.S.C. § 371, of PCT/CN2017/092255, filed Jul. 7, 2017, designating the United States, which claims priority to Chinese Application No. 201710495891.6, filed Jun. 6, 2017. The entire contents of the aforementioned patent applications are incorporated herein by this reference.

TECHNICAL FIELD

The present disclosure relates to a technical field of an organic electroluminescent device, and particularly relates to an evaporation source heating system.

RELATED ART

An organic electroluminescent device (i.e., OLED), with its advantages such as self-illumination, all-solid-state, high contrast, flexible display, etc., has gradually become a technology which has the most potential development prospect at the current display market. At present, a vacuum evaporation technology is generally adopted to prepare the OLED in the industry; in the evaporation process, organic materials are placed in a crucible, the materials are vaporized by controlling the heating system to be deposited on a glass substrate; an energy required for vaporizing the organic materials in the process is obtained through a conduction of a side wall of the crucible, wherein the crucible filled with the organic materials is heated up by energizing a circle of heating coil outside the crucible, and heat is scattered to an inner portion from the side wall of the crucible.

However, the following problems exist in the practical evaporation process: (1) the organic materials in the crucible need to be heated slowly for a long time so that the materials can be heated uniformly; and (2) a risk of occurring a crack may exist in the material nearer to the side wall of the crucible due to exorbitant local temperature. Thus, it is necessary to provide a better evaporation heating system.

SUMMARY

In view of lack existing in the prior art, the present disclosure provides a new evaporation source heating system, heating the organic materials in the crucible uniformly can be realized, and a crack of the organic materials in the crucible caused due to exorbitant local temperature can be avoided.

In order to achieve the above purpose, the technical solution applied in the present disclosure is as follows:

An evaporation source heating system includes a vacuum heating container, a first heating source disposed around an outer peripheral surface of the heating container and a soaking layer disposed in the heating container, and the soaking layer is disposed opposite to an inner wall of the heating container so as to uniformly transmit heat emitted from the inner wall of the heating container.

As one implementation therein, the evaporation source heating system further includes second heating source to heat the soaking layer.

As one implementation therein, the soaking layer is a barrel.

As one implementation therein, the soaking layer is fitted with the heating container.

As one implementation therein, the soaking layer includes a plurality of soaking fins radially extending from a center, and the plurality of soaking fins are arranged at intervals in a circumferential direction of the soaking layer.

As one implementation therein, the first heating source is a spiral resistance heating coil, and surround a periphery of the heating container in a height direction thereof.

As one implementation therein, the evaporation source heating system further includes a heat protection cover and a reflection plate, wherein the reflection plate is a barrel and surrounds peripheries of the first heating source in a spaced manner, and the heat protection cover is disposed on a top of the reflection plate.

As one implementation therein, the second heating source includes an induction coil disposed to surround external sides of the first heating source, and alternate currents are conducted to the second heating source to make the soaking layer emit heat.

As one implementation therein, a heat insulation layer is further disposed between the second heating source and the first heating source.

As one implementation therein, the evaporation source heating system further includes a collection unit for detecting a material evaporation rate in the heating container, and heating powers of the first heating source is adjusted according to the evaporation rate detected by the collection unit.

The present disclosure provides the soaking layer in the heating container of the evaporation source heating system, on one hand, a risk of material crack caused due to exorbitant local temperature is avoided, and on the other hand, heating uniformity is also improved. In addition, by heating the soaking layer in the heating container, time needed for realizing uniform heating is sharply shortened, and a heating state of the system is also real-time controlled more conveniently.

DETAILED DESCRIPTION

In order for a purpose, technical solutions and advantages of the present invention to be clearer and understood, the present invention will be further explained below in conjunction with the figures and embodiments. It should be understood that, the described specific embodiments here are only used to explain the present invention, but not used to limit the present invention.

Embodiment 1

Figure 1:
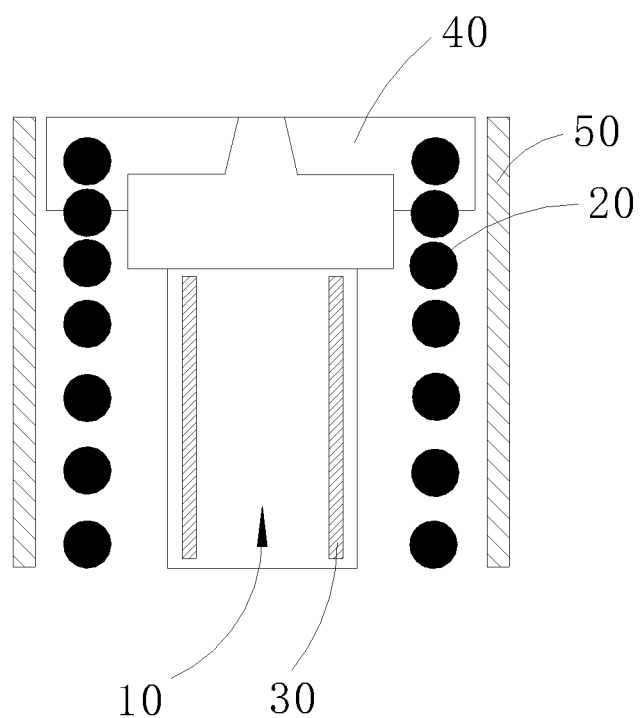
FIG. 1 is a structure schematic diagram of an evaporation source heating system according to embodiment 1 of the present invention.

Referring to FIG. 1, an evaporation source heating system of the present embodiment includes a vacuum heating container 10, a first heating source 20 disposed around an outer peripheral surface of the heating container 10 and a soaking layer 30 disposed in the heating container 10, the heating container 10 is used for placing organic materials for evaporation therein, and the soaking layer 30 is disposed opposite to an inner wall of the heating container, and is best to be in a fitting state with the heating container 10, so as to largely and uniformly transmit heat emitted from the inner wall of the heating container 10.

Here, the heating container 10 is a crucible which is roughly configured in a cylindrical container; accordingly, the soaking layer 30 is a barrel, the first heating source 20 is a spiral resistance heating coil, and surrounds a periphery of the heating container 10 in a height direction thereof; the heat generated from the first heating source 20 firstly passes through a side wall of the heating container 10 to be radiated to the soaking layer 30 before heating the organic materials in an inner portion, the soaking layer 30 is indirectly used to vaporise and heat the organic materials, so that heating uniformity is ensured, and a crack of the organic material disposed nearest to the side wall of the heating container 10 caused due to exorbitant local temperature can also be avoided.

A heat protection cover 40 and a reflection plate 50 are further disposed around the first heating source 20, in specific, the reflection plate 50 surrounds peripheries of the first heating source 20 in a spaced manner, and the reflection plate 50 is a barrel configuration and made of heat protection materials, and can prevent heat from being radiated outward, so as to improve usage rate of the heat. The heat protection cover 40 is disposed on a top of the reflection plate 50, so as to avoid the heat of the first heating source 20 being overflew to cause heat loss.

Further, in order to master an evaporation rate of the organic materials in the heating container 10 in real time, the present embodiment further provides a collection unit (not shown in the figure) for detecting the evaporation rate of the materials in the heating container 10 in the evaporation source heating system, and in the practical evaporation process, the system can adjust heating powers of the first heating source 20 in real time according to the evaporation rate collected by the collection unit, so as to keep a constant evaporation rate.

Embodiment 2

Figure 2:
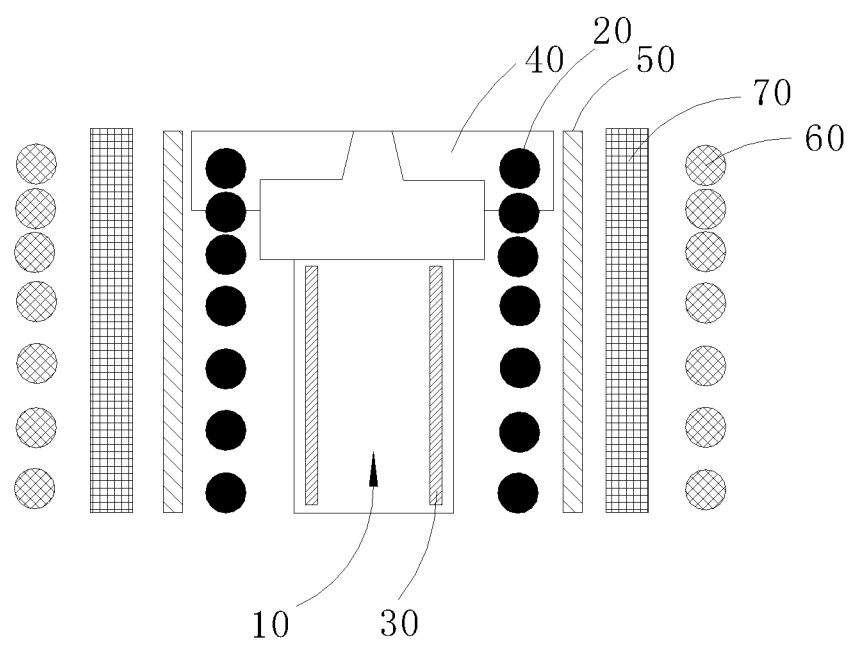
FIG. 2 is a structure schematic diagram of an evaporation source heating system according to embodiment 2 of the present invention.

As shown in FIG. 2, on the basis of Embodiment 1, the evaporation source heating system of the present embodiment further includes a second heating source 60 to heat the soaking layer 30, and since the soaking layer 30 is disposed in the heating container 10, is nearer to the organic materials in comparison with the first heating source 20, and can improve a heating speed more obviously.

The second heating source 60 includes an induction coil disposed to surround external sides of the first heating source 20, and alternate currents are conducted to the second heating source 60 to make the soaking layer 30 emit heat. The second heating source 60 is disposed outside the reflection plate 50, moreover, a heat insulation layer 70 is further disposed between the second heating source 60 and the reflection plate 50. The second heating source 60 can heat the soaking layer 30 in the heating container 30 using a non-contact manner, and an existence of the heat insulation layer 70 avoids the first heating source 20 damaging and interfering the induction coil, when the first heating source 20 cannot rapidly heat up the inner wall of the heating container 10 in the first time, the second heating source 60 can exert their advantages, and heat the heating container 10 and the organic materials simultaneously at a fastest speed, to shorten the starting time of the system, and after the system is started, heating temperatures of the second heating source 60 can be reduced according to the requirement, and the first heating source 20 is still used as main heating source. In the evaporation process, the collection unit still detects the evaporation rate of the materials in the heating container 10 in real time, and the system accordingly adjusts the heating powers of the first heating source 20 in real time, so as to keep a constant evaporation rate.

Embodiment 3

Figure 3:
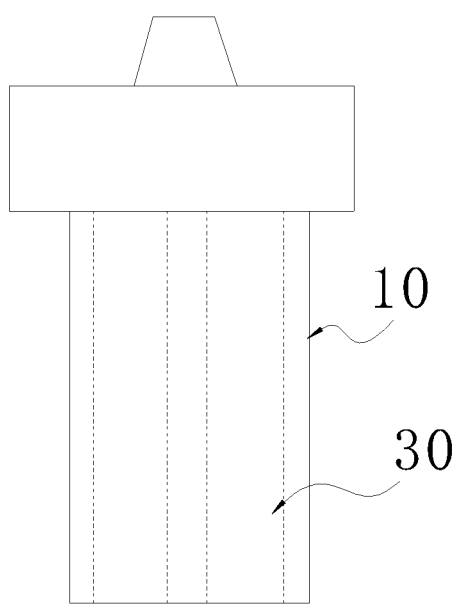
FIG. 3 is a schematic diagram of a usage state of a soaking layer according to embodiment 3 of the present invention.
Figure 4:
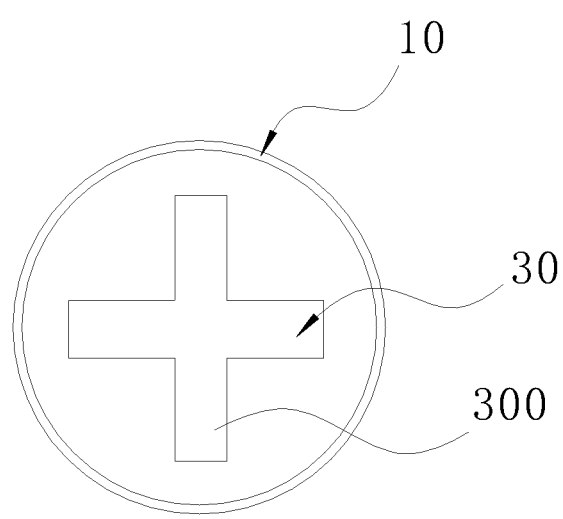
FIG. 4 is a schematic diagram of a placement state of a soaking layer according to embodiment 3 of the present invention.

As shown in FIGS. 3 and 4, as a configuration of the soaking layer 30 therein, the soaking layer 30 of the present embodiment is in a cross structure integrally formed by four soaking fins 300, it can be understood that the number of the soaking fins 300 in the soaking layer 30 is not limited to four, a plurality of soaking fins 300 radially extend from a center of the soaking layer 30 to form an impeller structure, that is, the plurality of soaking fins 300 are arranged at intervals in a circumferential direction of the soaking layer, an interval formed between two adjacent soaking fins 300 can be used for placing the organic materials to be heated, it is best that angles between each two adjacent soaking fins 300 are the same, so as to make the heating more uniform, the heat generated by respective soaking fins 300 can be better radiated to the corresponding organic materials, and the heating speed is improved to some extent.

The present invention provides the soaking layer in the heating container of the evaporation source heating system, on one hand, a risk of material crack caused due to exorbitant local temperature is avoided, and on the other hand, heating uniformity is also improved. In addition, by heating the soaking layer in the heating container, time needed for realizing uniform heating is sharply shortened, and a heating state of the system is also real-time controlled more conveniently.

The above statements are only the specific embodiments of the present application, it should be pointed out that, to those ordinary skilled in the art, several improvements and polish can be made without departing from the principle of the present application, also those improvements and polish should be considered as the protection scope of the present application.

What is claimed is:

1. An evaporation source heating system for heating organic materials, comprising:
   a vacuum heating container;
   a first heating source disposed around an outer peripheral surface of the heating container;
   a soaking layer disposed in the heating container, wherein the soaking layer is formed in a barrel shape to contain the organic materials in an inner portion thereof, and wherein a gap is formed between the soaking layer and an inner wall of the heating container; and
   a second heating source comprising an induction coil disposed to surround external sides of the first heating source, wherein alternate currents are conducted to the second heating source,
   wherein the soaking layer is both inductively heated by the second heating source and radiatively heated by the inner wall of the heating container that is heated by the first heating source based on resistive heating.

2. The evaporation source heating system as claimed in claim 1, wherein the first heating source is a spiral resistance heating coil, and surrounds the outer periphery of the heating container in a height direction thereof.

3. The evaporation source heating system as claimed in claim 1, further comprising a heat protection cover and a reflection plate, wherein the reflection plate is a barrel and surrounds peripheries of the first heating source in a spaced manner, and the heat protection cover is disposed on the heating container adjacent to a top of the reflection plate.

4. The evaporation source heating system as claimed in claim 1, wherein a heat insulation layer is further disposed between the second heating source and the first heating source.

5. The evaporation source heating system as claimed in claim 1, wherein a heating power of the first heating source is adjusted according to a material evaporation rate detected in the heating container.

6. An evaporation source heating system, comprising:
    a vacuum heating container;
    a first heating source disposed around an outer peripheral surface of the heating container;
    a second heating source disposed outside the heating container; and
    a soaking layer disposed in the heating container,
    wherein the second heating source comprises an induction coil disposed to surround external sides of the first heating source, and alternate currents are conducted to the second heating source to make the soaking layer emit heat, and
    wherein the soaking layer comprises a plurality of soaking fins that are connected to each other at a center thereof and radially extending therefrom, the plurality of soaking fins are arranged at intervals in a circumferential direction of the soaking layer, and a gap is formed between an outer circumference of the soaking layer and an inner wall of the heating container, and
    wherein the soaking layer is both inductively heated by the second heating source and radiatively heated by the inner wall of the heating container that is heated by the first heating source based on resistive heating.

7. The evaporation source heating system of claim 6, wherein the first heating source is a spiral resistance heating coil, and surrounds a periphery of the heating container in a height direction thereof.

8. The evaporation source heating system of claim 6, further comprising a heat protection cover and a reflection plate, wherein the reflection plate is a barrel and surrounds peripheries of the first heating source in a spaced manner, and the heat protection cover is disposed on the heating container adjacent to a top of the reflection plate.

9. The evaporation source heating system of claim 6, further comprising a heat insulation layer disposed between the second heating source and the first heating source.

10. The evaporation source heating system of claim 6, wherein a heating power of the first heating source is adjusted according to a material evaporation rate detected in the heating container.

* * * * *